US009966518B2

(12) United States Patent
Su et al.

(10) Patent No.: US 9,966,518 B2
(45) Date of Patent: May 8, 2018

(54) PACKAGE SUBSTRATE AND LED FLIP CHIP PACKAGE STRUCTURE

(71) Applicant: KAISTAR Lighting (Xiamen) Co., Ltd., Xiamen (CN)

(72) Inventors: Yi Ching Su, Xiamen (CN); Yung-Chih Chen, Xiamen (CN); Steve Meng-Yuan Hong, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days. days.

(21) Appl. No.: 15/187,930

(22) Filed: Jun. 21, 2016

(65) Prior Publication Data

US 2017/0162755 A1   Jun. 8, 2017

(30) Foreign Application Priority Data

Dec. 2, 2015   (CN) .......................... 2015 1 0873346

(51) Int. Cl.
| H01L 33/62 | (2010.01) |
| H01L 23/00 | (2006.01) |
| H01L 33/48 | (2010.01) |

(52) U.S. Cl.
CPC .............. *H01L 33/62* (2013.01); *H01L 24/10* (2013.01); *H01L 33/486* (2013.01); *H01L 2224/10175* (2013.01)

(58) Field of Classification Search
CPC ..... H01L 33/502; H01L 25/075; H01L 33/62; H01L 33/54; H01L 2924/151; H01L 2924/1511
See application file for complete search history.

(56) References Cited

U.S. PATENT DOCUMENTS 6,507,120 B2 * 1/2003 Lo ....................... H01L 23/3107
257/673
6,750,546 B1 * 6/2004 Villanueva .......... H01L 23/3107
257/666

(Continued)

FOREIGN PATENT DOCUMENTS

| CN | 101673790 A | * | 3/2010 |
| CN | 103188863 A | | 7/2013 |
| TW | 201336121 A1 | | 9/2013 |

OTHER PUBLICATIONS

CN 101679790 A machine translation.*

*Primary Examiner* — Yu Chen
*Assistant Examiner* — Vincent Wall
(74) *Attorney, Agent, or Firm* — Hemisphere Law, PLLC; Zhigang Ma

(57) ABSTRACT

A package substrate includes: an insulating substrate, a first and a second soldering pads spacedly disposed on a first surface of the insulating substrate, a first and a second electrodes spacedly disposed on an opposite second surface of the insulting substrate. The first and the second soldering pads are electrically connected to the first and the second electrodes respectively. Moreover, a first and a second grooves are defined on the first surface of the insulating substrate, the first and the second grooves are spaced from each other and disposed between the first and the second soldering pads. The invention further provides a LED flip chip package structure including the package substrate, a LED flip chip and fluorescent glue. The invention adds the grooves in the spacing between the soldering pads as a buffer space for melted solder flowing during reflow soldering process and therefore can relieve short-circuit phenomenon.

18 Claims, 4 Drawing Sheets

(56) References Cited

U.S. PATENT DOCUMENTS

| | | | | |
|---|---|---|---|---|
| 7,250,684 | B2* | 7/2007 | Nickerson | B23K 20/004 |
| | | | | 228/180.5 |
| 8,247,833 | B2* | 8/2012 | Shen | H01L 33/62 |
| | | | | 257/432 |
| 8,664,674 | B2* | 3/2014 | Aketa | H01L 25/0753 |
| | | | | 257/88 |
| 9,153,745 | B2* | 10/2015 | Seo | H01L 33/486 |
| 2005/0067177 | A1 | 3/2005 | Saito et al. | |
| 2014/0332839 | A1 | 11/2014 | Choi et al. | |

* cited by examiner

PACKAGE SUBSTRATE AND LED FLIP CHIP PACKAGE STRUCTURE

FIELD OF THE INVENTION

The invention relates to a flip chip package technical field, and more particularly to a package substrate and a LED flip chip package structure.

BACKGROUND OF THE INVENTION

As a distance between a positive (P) electrode and a negative (N) electrode of a LED flip chip is around 75~150 micrometers (μm), in a conventional design of ceramic package substrate used in a flip chip technique, when performing reflow soldering after die bonding and/or when the LED flip chip package structure undergoing a second reflow soldering of a back-end surface mounted technology (SMT) process, a short-circuit phenomenon may be easily occurred resulting from solders melting and flowing, which would result in the LED malfunction.

Specifically, referring to FIG. 1, it is a structural view of a conventional LED flip chip package structure. As shown in FIG. 1, a LED flip chip package structure 10 includes: a ceramic substrate 11, soldering pads 12a, 12b, metal-filled holes 13, electrodes 14a, 14b, a LED flip chip 15, a bowl-shaped structure 18 and a fluorescent glue 19. The soldering pads 12a, 12b are disposed on an upper surface of the ceramic substrate 11 and spaced from each other, the electrodes 14a, 14b are disposed on a lower surface of the ceramic substrate 11 and spaced from each other, the soldering pads 12a, 12b respectively are electrically connected to the electrodes 14a, 14b by the metal-filled holes 13. The LED flip chip 15 is disposed with a positive electrode 151 and a negative electrode 153, and the positive electrode 151 and the negative electrode 153 respectively are electrically connected to the soldering pads 12a, 12b by solders 16. The bowl-shaped structure 18 is disposed on the upper surface of the ceramic substrate 11 and surrounding the LED flip chip 15. The fluorescent glue 19 is disposed in the bowl-shaped structure 18 and covering the LED flip chip.

Referring to FIG. 2, it is a microscopic photograph showing the soldering pads in the LED flip chip package structure shown in FIG. 1. As seen from FIG. 1 and FIG. 2, it can be found that since a distance between the soldering pads 12a, 12b is relatively short, during a reflow soldering process, the solders 16 would be melted and flow into a region between the soldering pad 12a and the soldering pad 12b and thereby cause the soldering pad 12a and the soldering pad 12b to be electrically connected with each other, as a result, a short-circuit phenomenon as shown in FIG. 2 would be occurred.

SUMMARY OF THE INVENTION

Therefore, aiming at the insufficiency in the foregoing related art, the invention provides a package substrate and a LED flip chip package structure.

Specifically, a package substrate according to an embodiment of the invention includes: an insulating substrate, a first soldering pad and a second soldering pad spacedly disposed on a first surface of the insulating substrate, a first electrode and a second electrode spacedly disposed on a second surface opposite to the first surface of the insluting substrate. The first soldering pad and the second soldering pad are electrically connected to the first electrode and the second electrode respectively. Moreover, a first groove and a second groove are defined on the first surface of the insulating substrate, the first groove and the second groove are spaced from each other and located between the first soldering pad and the second soldering pad.

In an embodiment of the invention, a depth of each of the first groove and the second groove is in a range from 20 micrometers to 30 micrometers.

In an embodiment of the invention, each of the first groove and the second groove includes a main part and an extension part laterally protruding from the main part.

In an embodiment of the invention, the extension part is substantially round.

In an embodiment of the invention, the first groove is one of an L shape and a reversed L shape, and the second groove is the other one of the L shape and the reversed L shape.

In an embodiment of the invention, a distance between the first groove and the second groove is 10%~50% of a distance between the first soldering pad and the second soldering pad.

In an embodiment of the invention, a length of the first groove is approximately 95% of a length of a side of the first soldering pad adjacent to the first groove, and a length of the second groove is approximately 95% of a length of a side of the second soldering pad adjacent to the second groove.

In an embodiment of the invention, a depth of each of the first groove and the second groove is 10%~15% of a thickness of the insulating substrate.

In an embodiment of the invention, the package substrate further includes a bowl-shaped structure disposed on the first surface of the insulating substrate, and the bowl-shaped structure is disposed surrounding the first soldering pad and the second soldering pad as well as the first groove and the second groove.

In an embodiment of the invention, a material of the bowl-shaped structure is a high reflective plastic such as silicone molding compound or epoxy molding compound.

In an embodiment of the invention, the insulating substrate is a ceramic substrate, the first groove and the second groove are formed by sintering directly, or formed by laser engraving after the ceramic substrate being sintered.

Moreover, a LED flip chip package structure according to an embodiment of the invention includes a LED flip chip, fluorescent glue and the package substrate according to any one of the above described embodiments. A positive electrode and a negative electrode of the LED flip chip respectively are electrically connected to the first soldering pad and the second soldering pad by solder, and the fluorescent glue is disposed covering the LED flip chip.

In an embodiment of the invention, the first soldering pad and the second soldering pad respectively are electrically connected to the first electrode and the second electrode by metal-filled holes respectively disposed rightly below the positive electrode and the negative electrode of the LED flip chip.

Sum up, the above embodiments of the invention define grooves in the spacing between the soldering pads on the surface of the insulating substrate (e.g., a ceramic substrate) as a buffer space for solder flowing after being melted during a reflow soldering process, so that the short-circuit phenomenon can be relieved consequently.

By the following detailed description with reference to accompanying drawings, other aspects and features of the invention will become apparent. However, it should be understood that, the drawings only are for the purpose of explanation and not as limiting the scope of the invention, and the scope of the invention should refer to the appended claims. It also be appreciated that, unless otherwise indicated, the drawings are not necessarily drawn to scale, they are merely trying to conceptually illustrate the structures and procedures described herein.

BRIEF DESCRIPTION OF THE DRAWINGS

In the following, with reference to accompanying drawings, concrete embodiments of the invention will be described in detail.

DETAILED DESCRIPTION OF PREFERRED EMBODIMENTS

Embodiments of the invention are described in detail with reference to the accompanying drawings as follows to better understand the objectives, features and advantages of the invention.

Figure 1:
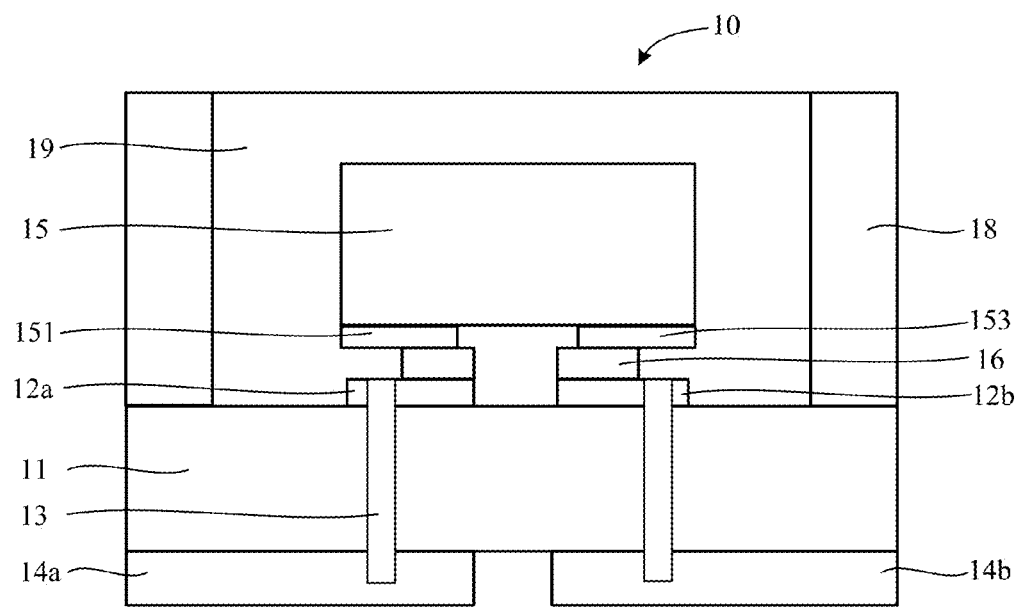
FIG. 1 is a schematic view of a conventional LED flip chip package structure.
Figure 2:
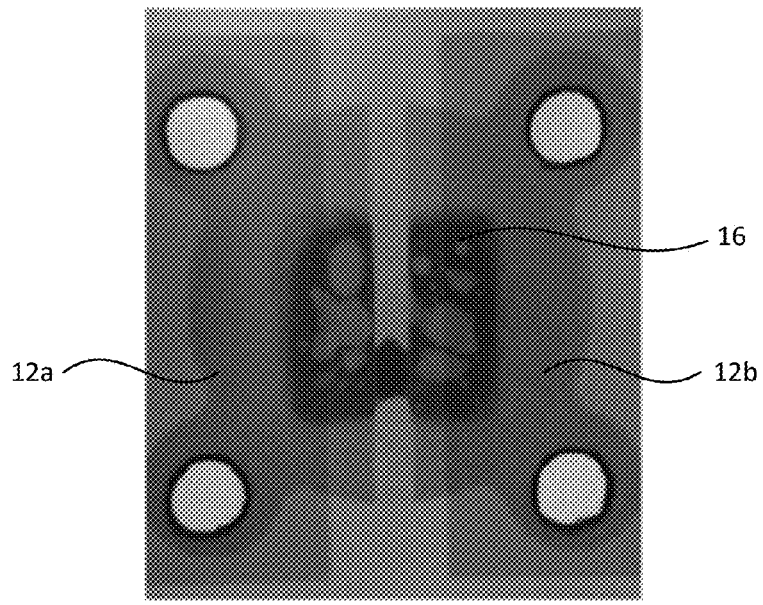
FIG. 2 is a microscopic photograph showing soldering pads in the LED flip chip package structure shown in FIG. 1.
Figure 3:
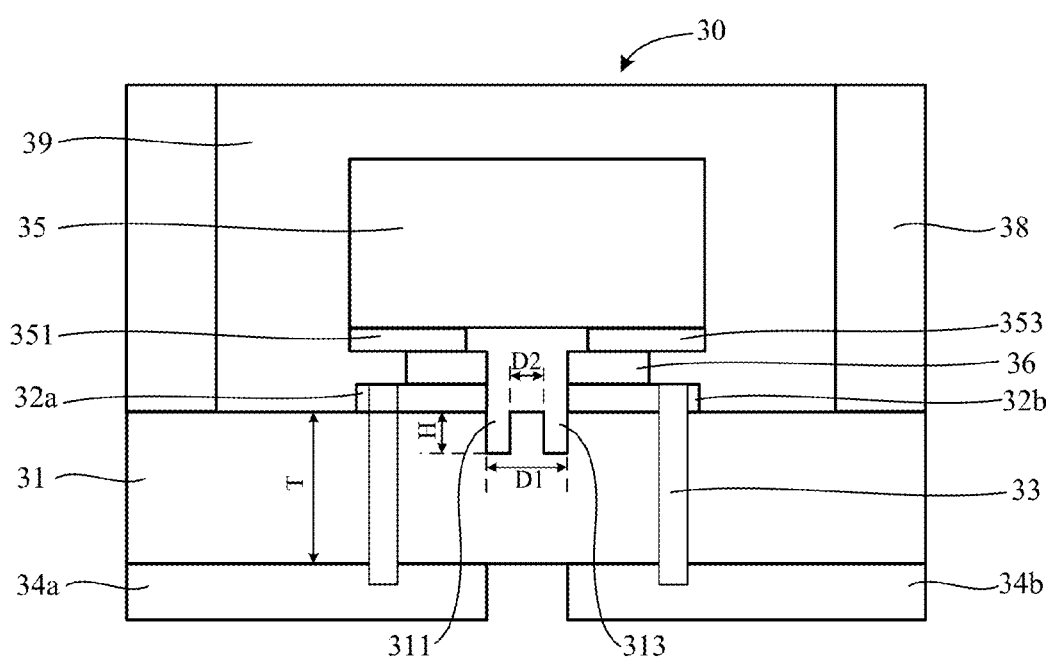
FIG. 3 is a schematic view of a LED flip chip package structure according to an embodiment of the invention.
Figure 4:
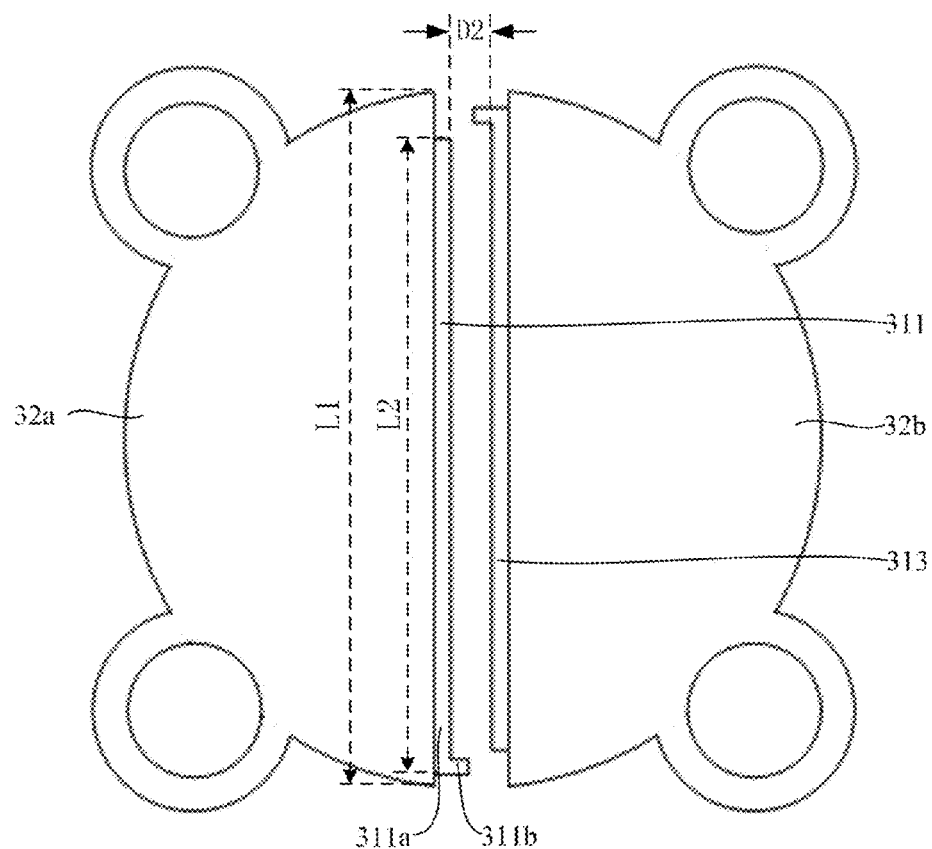
FIG. 4 is an enlarged schematic view of soldering pads and grooves in the LED flip chip package structure shown in FIG. 3 from another angle of view.

Referring to FIG. 3 and FIG. 4 together, a LED flip chip package structure 30 according to an embodiment of the invention includes: an insulating substrate 31, soldering pads 32*a*, 32*b*, metal-filled holes 33, electrodes 34*a*, 34*b*, a LED flip chip 35, a bowl-shaped structure 38 and a fluorescent glue 39. The insulating substrate 31, the soldering pads 32*a*, 32*b*, the metal-filled holes 33 and the electrodes 34*a*, 34*b* and even the bowl-shaped structure 38 together form a package substrate of the embodiment.

A material of the insulating substrate 31 is ceramic such as aluminum oxide ($Al_2O_3$), but the invention is not limited to this, other ceramic material can be adopted instead. The soldering pads 32*a*, 32*b* are disposed on an upper surface of the insulating substrate 31 and spaced from each other, and further the soldering pads 32*a*, 32*b* for example are made of copper. The electrodes 34*a*, 34*b* are disposed on a lower surface of the insulating substrate 31 and spaced from each other, and further the electrodes 34*a*, 34*b* for example are made of copper. Furthermore, the soldering pad 32*a* is electrically connected to the electrode 34*a* by the metal-filled hole 33, the soldering pad 32*b* is electrically connected to the electrode 34*b* by the other metal-filled hole 33, and each of the metal-filled holes 33 penetrates through the insulating substrate 31. A positive electrode 351 and a negative electrode 353 of the LED flip chip 35 respectively are electrically connected to the soldering pad 32*a* and the soldering pad 32*b* disposed on the upper surface of the insulating substrate 31 by solders 36, and each of the metal-filled holes 33 is preferably disposed rightly below the positive electrode 351 and the negative electrode 353 of the LED flip chip 35. The bowl-shaped structure 38 is disposed around the soldering pads 32*a*, 32*b* as well as the LED flip chip 35, a material of the bowl-shaped structure 38 for example is a material with high reflectivity such as silicone molding compound (SMC) or epoxy molding compound (EMC), but the invention is not limited to this. The fluorescent glue 39 is disposed in the bowl-shaped structure 38 and covering the LED flip chip 35. The fluorescent glue 39 can be prepared by dispersing fluorescent powers in resin or by coating an inner surface of a resin layer with a fluorescent layer.

In addition, a groove 311 and a groove 313 are spacedly formed in a region (also referred to as spacing between the soldering pad 32*a* and the soldering pad 32*b*) between the soldering pad 32*a* and the soldering pad 32*b* on the upper surface of the insulating substrate 31, so that during a reflow soldering process, if the solders 36 being melted flow towards the region between the soldering pads 32*a*, 32*b*, the grooves 311, 313 would act as spatial buffers so as to prevent the occurrence of short-circuit phenomenon. In the illustrated embodiment, the groove 311 and the groove 313 can be formed during sintering the insulating substrate 31 such as ceramic substrate, or formed by laser engraving after sintering the ceramic substrate.

To be more specific, a depth H of each of the groove 311 and the groove 313 preferably is 10%~15% of a thickness T of the insulating substrate 31. Typically, the depth H of each of the groove 311 and the groove 313 is in a range from 20 micrometers to 30 micrometers. A distance D2 between the groove 311 and the groove 313 preferably is 10%~50% of a distance between the soldering pad 32*a* and the soldering pad 32*b*.

Figure 5:
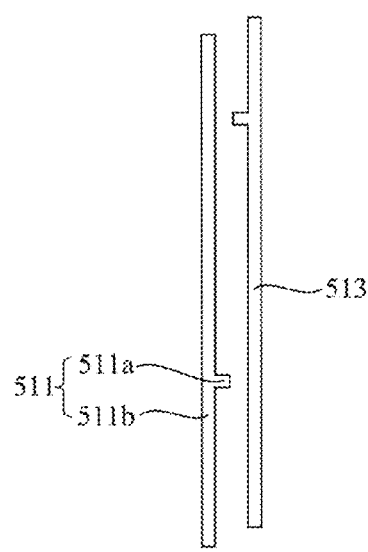
FIG. 5 is a structural schematic view of another groove according to an embodiment of the invention.
Figure 6:
FIG. 6 is a structural schematic view of still another groove according to an embodiment of the invention.

Moreover, referring to FIG. 4, with regard to each of the groove 311 and the groove 313, the groove 311 is taken as an example, it includes a main part 311*a* and an extension part 311*b* laterally protruding from the main part 311*a*. The distance D2 between the groove 311 and the groove 313 is defined as a transverse distance between respective main parts of the grooves 311, 313. Preferably, the groove 311 and the groove 313 respectively are L-shaped and reversed L-shaped, the groove 311 is taken as an example, the extension part 311*b* of which is formed by laterally extending from an end of the main part 311*a*. Moreover, it is noted that extension parts of the grooves 311, 313 are not restricted to be formed by laterally protruding from the ends of the respective main parts as shown in FIG. 4, and can be like grooves 511, 513 as shown in FIG. 5 that extension parts of which are formed by laterally protruding from middle portions between two ends of respective main parts, the groove 511 is taken as an example, which includes a main part 511*a* and an extension part 511*b* laterally protruding from the main part 511*a*. Additionally, it can be found from FIG. 4 that the extension part 311*b* of the groove 311 and the extension part (not labeled in FIG. 4) of the groove 313 are staggeredly disposed in the longitudinal direction (i.e., the extending direction of the main part). Similarly, the extension part 511*b* of the groove 511 and the extension part (not labeled in FIG. 5) of the groove 513 are staggeredly disposed in the longitudinal direction. Furthermore, shapes of the extension parts of the grooves are not limited to those shown in FIG. 4 and FIG. 5, and can be other shape such as substantially a round shape shown in FIG. 6 instead, i.e., a round shape or an oval shape similar to the round shape.

Referring to FIG. 4 again, preferably, a length of the groove 311 for example is a length L2 of its main part 311*a* and is approximately 95% of a length L1 of a side of the soldering pad 32*a* adjacent to the groove 311; similarly, a length of the groove 313 for example is a length of its main part and is approximately 95% of a length of a side of the soldering pad 32*b* adjacent to the groove 313.

In summary, the above embodiments of the invention define grooves in the spacing between the soldering pads on the surface of the insulating substrate such as ceramic substrate as a buffer space for solder flowing after being melted during a reflow soldering process, so that the short-circuit phenomenon can be relieved consequently.

The above description illustrates various exemplary embodiments to explain the invention, and the foregoing exemplary embodiments only are used to help understand the solution of the invention and its core idea. For those skilled persons in the art, various modifications and variations can be made according to the concept of the invention, and therefore the invention needs not be limited to the disclosed embodiments. It is intended to cover various modifications and similar arrangements included within the spirit and scope of the appended claims which are to be accorded with the broadest interpretation so as to encompass all such modifications and similar structures.

What is claimed is:

1. A package substrate comprising: an insulating substrate, a first soldering pad and a second soldering pad disposed on a first surface of the insulating substrate, a first electrode and a second electrode disposed on a second surface opposite to the first surface of the insulting substrate; the first soldering pad and the second soldering pad being spaced apart, the first electrode and the second electrode being spaced apart, the first soldering pad and the second soldering pad being electrically connected to the first electrode and the second electrode respectively; wherein a first groove and a second groove are recessedly defined on the first surface of the insulating substrate, the first groove and the second groove are spaced from each other and located in a non-soldering-pad region between the first soldering pad and the second soldering pad, a bottom surface of each of the first groove and the second groove is lower than a bottom surface of each of the first soldering pad and the second soldering pad;

wherein each of the first groove and the second groove comprises an elongated main part and an extension part laterally protruding from the elongated main part in a widthwise direction of the elongated main part; the extension part of the first groove and the extension part of the second groove are located between the elongated main parts of the first groove and the second groove and further are staggeredly disposed in a lengthwise direction of the elongated main part intersecting with the widthwise direction.

2. The package substrate according to claim 1, wherein a depth of each of the first groove and the second groove is in a range from 20 micrometers to 30 micrometers.

3. The package substrate according to claim 1, wherein the extension part is substantially round.

4. The package substrate according to claim 1, wherein the first groove is one of an L shape and a reversed L shape, and the second groove is the other one of the L shape and the reversed L shape.

5. The package substrate according to claim 1, wherein a distance between the first groove and the second groove is 10%~50% of a distance between the first soldering pad and the second soldering pad.

6. The package substrate according to claim 1, wherein a length of the first groove is approximately 95% of a length of a side of the first soldering pad adjacent to the first groove, and a length of the second groove is approximately 95% of a length of a side of the second soldering pad adjacent to the second groove.

7. The package substrate according to claim 1, wherein a depth of each of the first groove and the second groove is 10%~15% of a thickness of the insulating substrate.

8. The package substrate according to claim 1, further comprising a bowl-shaped structure disposed on the first surface of the insulating substrate; wherein the bowl-shaped structure is disposed surrounding the first soldering pad and the second soldering pad as well as the first groove and the second groove.

9. The package substrate according to claim 8, wherein a material of the bowl-shaped structure is a silicone molding compound or an epoxy molding compound.

10. The package substrate according to claim 1, wherein the insulating substrate is a ceramic substrate, the first groove and the second groove are formed by sintering directly, or formed by laser engraving after the ceramic substrate being sintered.

11. A LED flip chip package structure comprising: a LED flip chip, a fluorescent glue and a package substrate; the package substrate comprising: an insulating substrate, a first soldering pad and a second soldering pad disposed on a first surface of the insulating substrate, a first electrode and a second electrode disposed on a second surface opposite to the first surface of the insulting substrate; the first soldering pad and the second soldering pad being spaced apart, the first electrode and the second electrode being spaced apart, the first soldering pad and the second soldering pad being electrically connected to the first electrode and the second electrode respectively; wherein a first groove and a second groove are recessedly defined on the first surface of the insulating substrate, the first groove and the second groove are spaced from each other and located in a non-soldering-pad region between the first soldering pad and the second soldering pad, a bottom surface of each of the first groove and the second groove is lower than a bottom surface of each of the first soldering pad and the second soldering pad; wherein a positive electrode and a negative electrode of the LED flip chip respectively are electrically connected to the first soldering pad and the second soldering pad by solder, and the fluorescent glue is disposed covering the LED flip chip;

wherein each of the first groove and the second groove comprises an elongated main part and an extension part laterally protruding from the elongated main part in a widthwise direction of the elongated main part; the extension part of the first groove and the extension part of the second groove are located between the elongated main parts of the first groove and the second groove and further are staggeredly disposed in a lengthwise direction of the elongated main part intersecting with the widthwise direction.

12. The LED flip chip package structure according to claim 11, wherein the first soldering pad and the second soldering pad respectively are electrically connected to the first electrode and the second electrode by metal-filled holes respectively located rightly below the positive electrode and the negative electrode of the LED flip chip.

13. The LED flip chip package structure according to claim 11, wherein a depth of each of the first groove and the second groove is in a range from 20 micrometers to 30 micrometers.

14. The LED flip chip package structure according to claim 11, wherein the extension part is substantially round.

15. The LED flip chip package structure according to claim 11, wherein the first groove is one of an L shape and a reversed L shape, and the second groove is the other one of the L shape and the reversed L shape.

16. The LED flip chip package structure according to claim 11, wherein a distance between the first groove and the second groove is 10%~50% of a distance between the first soldering pad and the second soldering pad; a length of the first groove is approximately 95% of a length of a side of the first soldering pad adjacent to the first groove, and a length of the second groove is approximately 95% of a length of a side of the second soldering pad adjacent to the second groove; a depth of each of the first groove and the second groove is 10%~15% of a thickness of the insulating substrate; the insulating substrate is a ceramic substrate, the first groove and the second groove are formed by sintering directly, or formed by laser engraving after the ceramic substrate being sintered.

17. The LED flip chip package structure according to claim 11, wherein the package substrate further comprises a bowl-shaped structure disposed on the first surface of the insulating substrate, and the bowl-shaped structure is disposed surrounding the first soldering pad and the second soldering pad as well as the first groove and the second groove.

18. The LED flip chip package structure according to claim 17, wherein a material of the bowl-shaped structure is a silicone molding compound or an epoxy molding compound.

* * * * *